United States Patent
Schaecher et al.

(10) Patent No.: US 6,434,736 B1
(45) Date of Patent: Aug. 13, 2002

(54) LOCATION BASED TIMING SCHEME IN MEMORY DESIGN

(75) Inventors: Mark A. Schaecher; Richard J. Burgess, Jr., both of Phoenix; Jay B. Miller, Chandler, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/351,100

(22) Filed: Jul. 8, 1999

(51) Int. Cl.[7] ............................................... G11C 11/00
(52) U.S. Cl. ........................................................ 716/17
(58) Field of Search ...................... 365/230.03; 710/25; 716/17

(56) References Cited

U.S. PATENT DOCUMENTS 6,028,810 A * 2/2000 Ooishi .................... 365/230.03

* cited by examiner

Primary Examiner—Matthew Smith
Assistant Examiner—Thuan Do
(74) Attorney, Agent, or Firm—Blakely, Sokoloff, Taylor & Zafman (57) ABSTRACT

A method and apparatus for improving the access time of a memory device is described. The location based timing scheme utilizes a subset of the address bits to adjust the timing of the sense amplifier enable in order to achieve a faster read of the information stored in the memory cell.

30 Claims, 7 Drawing Sheets

LOCATION BASED TIMING SCHEME IN MEMORY DESIGN

BACKGROUND OF THE INVENTION

1. Field of the Invention

The present invention relates to the field of memory design, and more specifically, to a memory having improved access time of instructions or data.

2. Background Information

The performance of a computer system is based, among other factors, on the memory access time. In order to reduce the number of average clock cycles necessary to access the memory, high speed memories may be utilized. A cache memory, as one example of a high speed memory, is used in many computer systems to improve system performance. A cache memory is a relatively small memory which resides either inside the central processor, also referred to as level one (L1) cache memory, or between the processor and the main system memory, also referred to as level two (L2) cache memory.

Caches improve the system performance by storing and supplying frequently used instructions or data in one or two clock cycles rather than two or more clock cycles generally required for a main memory access. The cache performance depends on two factors: access time and hit ratio. The hit ratio is defined as the probability of finding the needed information in the cache, which is a hit, divided by the probability of having to go to the main memory, which is a miss. The cache access time is the maximum time it takes to access the cache on a hit.

Following the conventional memory circuit design, the memory cells of a cache memory are organized into rows and columns. Wordlines are generally associated with rows of memory cells and bitlines are generally associated with columns of memory cells. During a typical memory read operation, the wordline for a particular memory cell to be read is asserted. In memories which use a differential sensing scheme to detect the contents of the memory, a differential is then developed between two bitlines coupled to the memory cell to be read. After the bitline differential has developed to a predetermined differential voltage, the associated sense amplifier can be enabled to read out the information on the selected memory cell.

During a memory operation, the processor anticipates the "worst case timing" memory response to a request for data and times the data transfer accordingly. In other words, for each memory operation, the processor assumes the longest amount of time (i.e. the worst case timing) to complete the operation, even if the memory operation can be completed in a shorter amount of time. Depending on the physical location of the cells in a memory array, the data access time for a read operation can differ between memory locations. In other words, due to the RC delay of the wordlines and bitlines, data belonging to a certain cell location in the memory array may be read faster than data found in other cell locations located farther away from the I/O circuitry. For example, in FIG. 2, the data in the cell 2 of the memory array 10 can be accessed faster than the data in the cell 4. For this example, the access time of data found in memory cell 4 will be referred to as the "worst case read", while the access time of the data found in memory cell 2 will be referred to as the "best case read". In conventional memory design, even if data is found in a cell location with a best case read, the sense amplifier is not enabled until the worst case read has achieved a certain bitline differential (i.e. the system presumes the worst case timing).

Thus, a new approach to improving memory read access time is needed which determines the sense amplifier enable time based on the location of the memory cell to be read.

SUMMARY OF THE INVENTION

A method for controlling a sense amplifier enable signal during a read operation in a memory array is described. A subset of address bits is selected from an address of a memory cell to be read. The subset of address bits is representative of a plurality of regions in the memory array. Each region of the plurality of regions comprises a plurality of memory cells. The plurality of regions are determined based on the subset of address bits, wherein each region of the plurality of regions is associated with a distinct region access time requirement. The memory cell of the plurality of memory cells to be read is selected and its corresponding region in the memory array is determined. The sense amplifier enable signal for the memory cell is timed based on the corresponding region access time requirement.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A method and apparatus for improving the access time of instructions and data during a memory read operation is disclosed. In the following description, numerous specific details are set forth such as specific memory read operation circuitry, size of memory array, logic and circuit configurations, etc. in order to provide a thorough understanding of the present invention. It will be obvious, however, to one skilled in the art that these specific details may not be needed in order to practice the present invention. In other instances, well-known processing steps have not been described in detail in order to avoid unnecessarily obscuring the present invention.

In conventional memory design, the timing scheme of a read operation has been based on the "worst case read" of the group of cells that are located the farthest from the I/O circuitry (X decoders, Y decoders, sense amplifiers) of the memory design. As such, even if the read operation is requested from a cell that may be read faster, i.e. the location of the cell is closer to the IO circuitry, the sense amplifier is enabled only after a predetermined time, i.e. the worst case delay. The location based timing scheme of the present invention adjusts the assertion of the sense amplifier enable signal based on the physical address of the cell to be read. Instead of waiting for the worst case delay, the location based timing scheme allows the memory elements to be read faster if their location in the memory array can be accessed faster.

Figure 1:
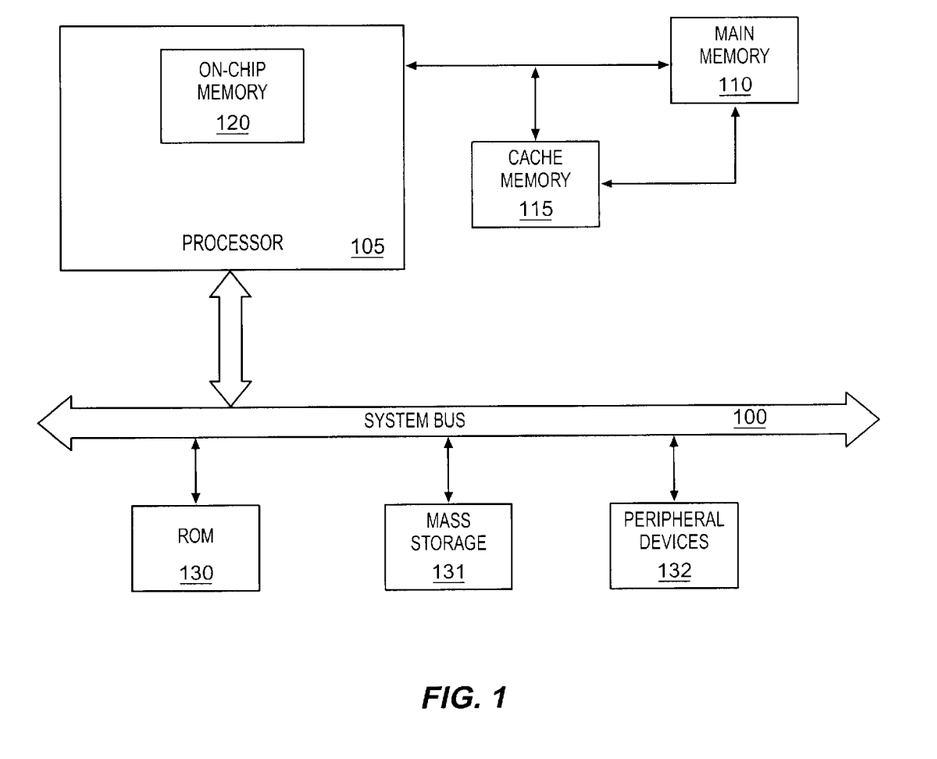
FIG. 1 illustrates a block diagram of one example of a computer system that may utilize memories which include the location based timing scheme of the present invention.

FIG. 1 illustrates a simplified block diagram of one example of a computer system including memories which may advantageously utilize the location based timing scheme of the present invention. The computer system of FIG. 1 includes a system bus 100 for communicating information, a processor 105 coupled to the bus 100 for processing information, a main memory 110 coupled to the processor 105 for storing information for the processor 105, and an external cache memory 115 for storing frequently and/or recently used information for the processor 105. The computer system also includes read-only memory 130 coupled to the system bus 100 for storing fixed information for the processor 105, a mass storage device 131 such as a hard disk drive for storing information for the processor 105, and peripheral devices 132 such as input devices, display devices, communication devices, and other computer system peripheral devices. It should be noted that the computer system of FIG. 1 is meant merely to be illustrative and that the computer system may also include additional devices or may not necessarily include all of the devices illustrated in FIG. 1.

The processor 105, in this example, includes an on-chip cache memory 120, also referred to as L1 cache memory. The L1 cache memory provides for very fast access time for a small amount of frequently or recently used information. The cache memory 120 includes the location based timing scheme of the present invention. As will be appreciated by those of skill in the art, although the location based timing scheme is described below as being configured on a memory such as the on-chip memory 120, other memories such as the cache memory 115 and the main memory 110 may also utilize and benefit from the location based timing scheme of the present invention.

Figure 2:
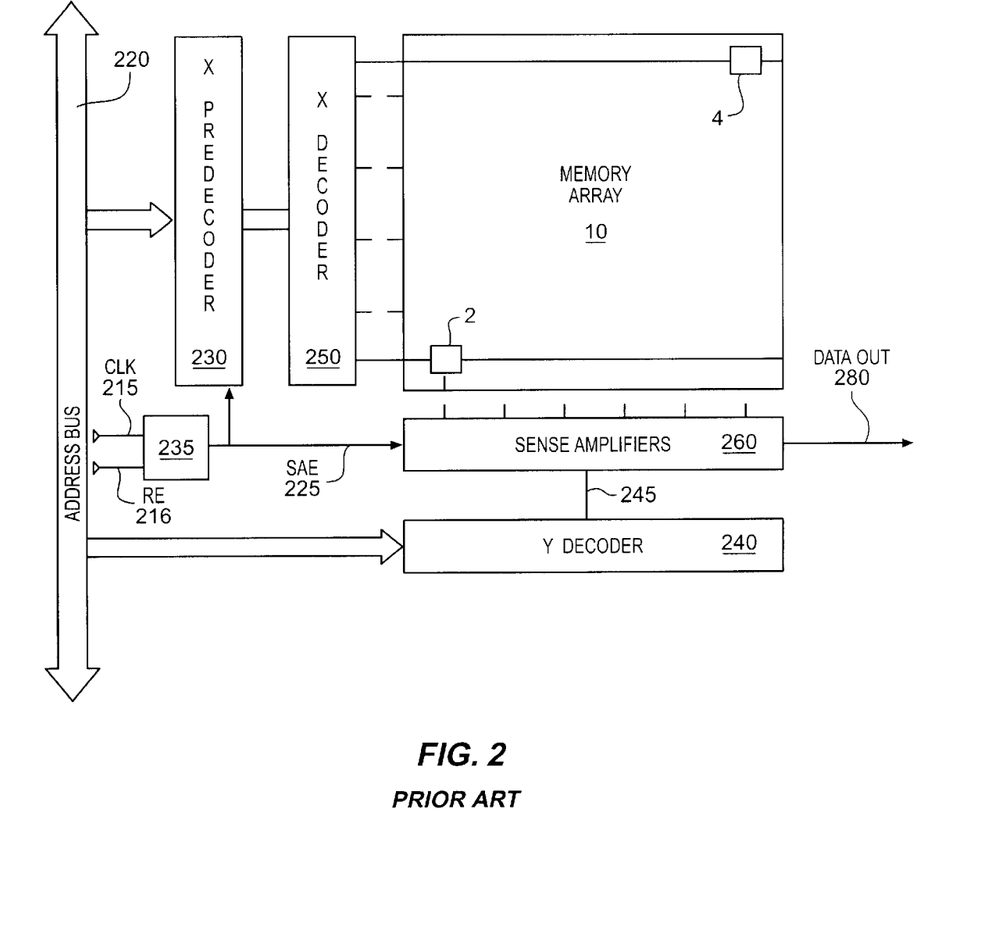
FIG. 2 illustrates a prior art memory design in which the read operation is synchronized by a clock using a worst case timing scheme.

FIG. 2 illustrates a conventional cache memory design using the worst case timing scheme. The memory design includes a memory array 10 organized in rows and columns, an address bus 220 for communicating the address, X predecoder circuits 230 coupled to the address bus 220 for predecoding the address bits, X decoder circuits 250 for asserting the wordlines of the memory array 10, and Y decoder circuits coupled to the address bus 220 for asserting the bitlines of the memory array 10. The contents of the memory array 10 are detected by the sense amplifiers 260. The address is clocked into the memory by the clock buffer 235.

During a memory read operation, a read enable RE signal 216 is received at the clock buffer 235, which generates a sense amplifier enable SAE signal 225 on a transitioning clock edge. The SAE signal 225 is received at the X predecoder 230 as well as at the sense amplifiers 260. In response to the SAE signal 225, the wordline of the memory cell to be read is asserted by the X decoder 250. The data from the selected cell is taken out onto the bit line to the sense amplifier where it is amplified and read out. The data is output on the data output bus 280. The read cycle of the memory illustrated in FIG. 2 typically extends for a period of one to two clock cycles.

Figure 3:
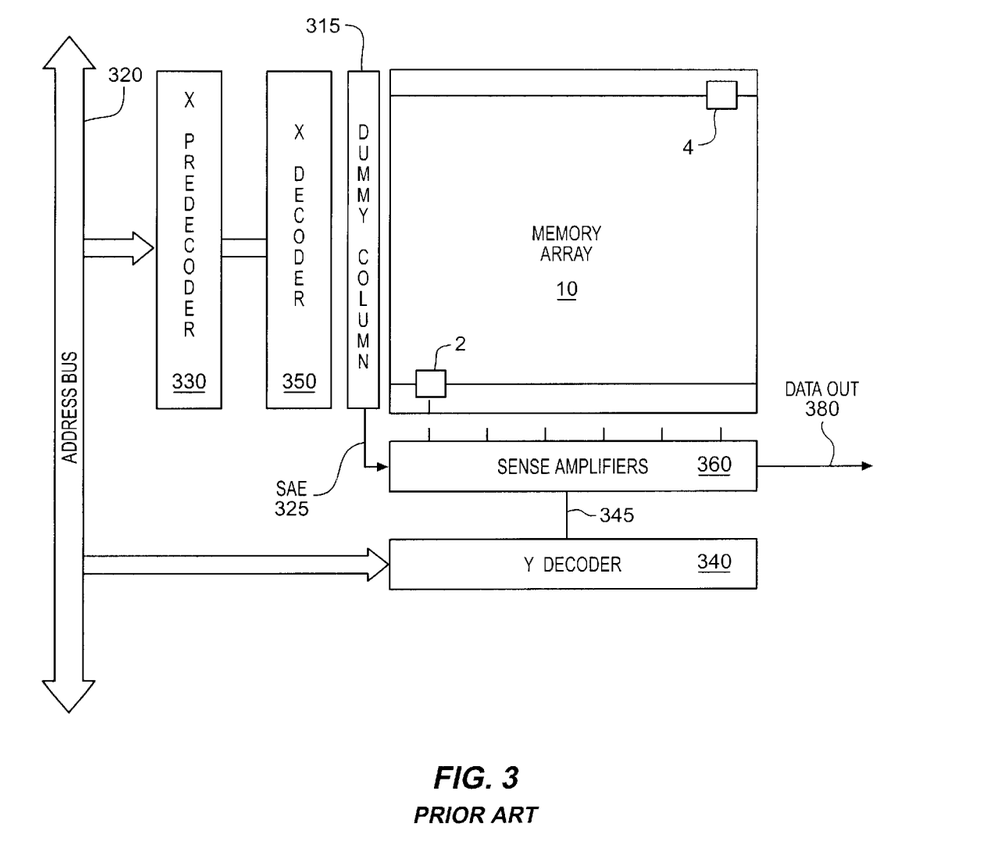
FIG. 3 illustrates a prior art memory design based on a worst case timing scheme in which the output read data is not governed by a clock.

FIG. 3 illustrates a conventional asynchronous memory design using the worst case timing scheme in which the data is not governed by a clock. The sense amplifier enable SAE signal 325 is asserted after a predetermined time which is the worst case read time. The sense amplifier is not enabled until a minimum differential voltage is developed between the bitlines. In order to delay the sense amplifier enable SAE signal 325, a dummy column 315 may be used. The dummy column of memory 315 is identical to an entire column of the memory array 10 and includes the circuitry, e.g. sense amplifier, necessary to initiate a memory read operation of the dummy column 315. During a read operation, the wordline of the memory cell to be read is activated. At the same time, a read operation of the dummy column is initiated. The read cycle of the dummy column represents the worst case read timing. The sense amplifier enable SAE signal 325 is based on the worst case read timing approximation.

During a read operation, instead of waiting for the worst case read timing, it may be desirable to read the information on the cells as soon as the data is available. Due to the spatial location of the cells in a memory array, there are groups of cells in the array that can be read faster than the worst case read cycle.

The worst case read cycle is based on the amount of time it takes to access the data from the group of cells that are located the farthest from the I/O circuitry in the memory array. Due to the resistance of the wire, the worst case delay represents the longest time necessary to complete the read cycle. For example, in the FIG. 2 and FIG. 3, the worst case read timing is based on the time it takes to access the cell 4, which is the farthest cell in the array. The closer the cells are located in the memory array 10 in reference to the wordline and bitline decoders, the faster the data from these cells can be accessed. As such, the cell 2 can be read faster than cell 4, and cell 2 represents the best case read timing.

Figure 4:
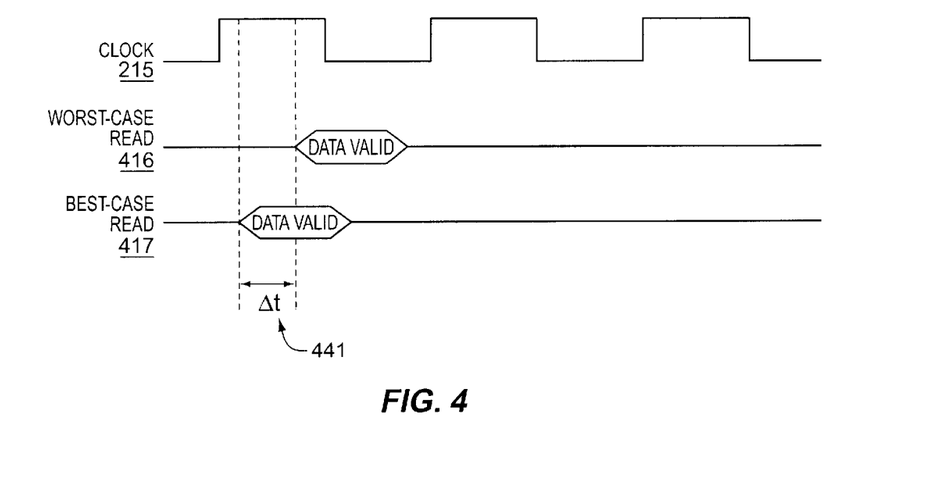
FIG. 4 is a timing diagram of the memory design of FIG. 2 illustrating the timing differences of a prior art read operation and a read operation according to one embodiment of the present invention.

FIG. 4 is a timing diagram comparing a read cycle in a synchronized memory design as illustrated in FIG. 2 and a read cycle based on availability of the data. The time Δt 41 represents the difference between the Worst Case Read 416 and the Best Case Read 417.

Figure 6:
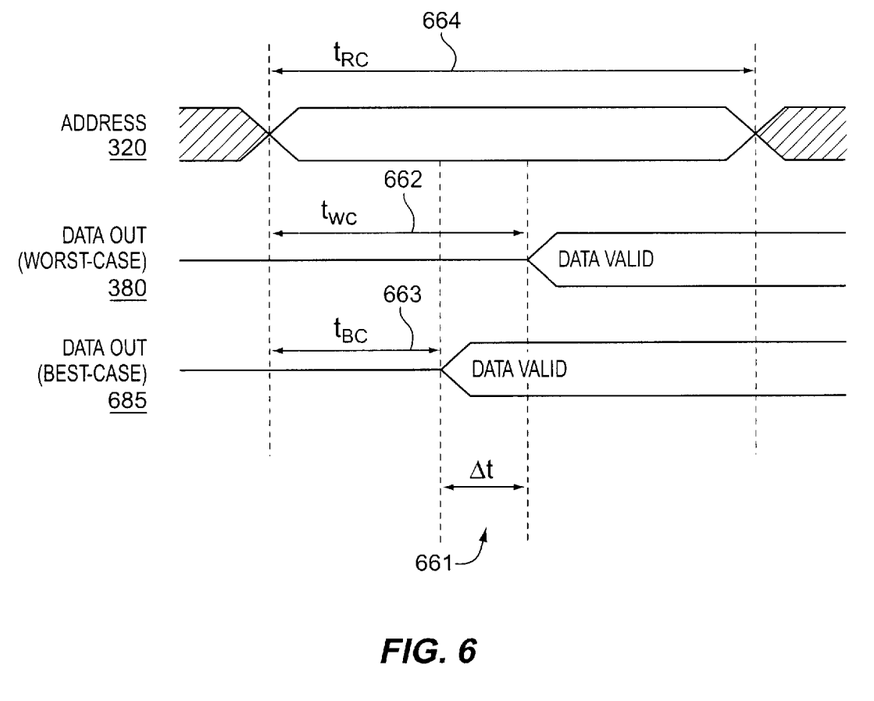
FIG. 6 is a timing diagram of the memory design of FIG. 3 illustrating the timing differences of a prior art read operation and a read operation according to another embodiment of the present invention.

FIG. 6 is a timing diagram of a memory design not governed by a clock as illustrated in FIG. 3. The address 320 represents the address in the memory from which a read operation is requested. The time, $t_{RC}$ 64, is the read cycle time. In the worst case read, Data Out 380, which is the data read from the memory array 10 of FIG. 3, is output after a worst case time delay, $t_{WC}$ 62. In comparison, in the best case read, Data Out 685 is output after a best case time delay, $t_{BC}$ 63. The difference between the time delays $t_{WC}$ and $t_{BC}$ is Δt 61.

The location based timing scheme in memory design of the present invention allows a read operation to be initialized as soon as the data is available. The speed of the memory may be adjusted by looking at the address of the cell to be read and determining its location in the memory array. Based on the cell location, the read operation of the cell may be initialized faster than the conventional delay time.

The location based timing scheme controls the sense amplifier enable signal during a read operation of a memory cell in a memory array. A subset of address bits is selected from the address of the memory cell to be read. The subset of address bits is representative of different regions in the memory array. Each region comprises a number of memory cells and is associated with a distinct region access time requirement. The memory cell to be read is selected and its corresponding region in the memory array is determined. The sense amplifier enable signal for the memory cell is timed based on the corresponding region access time requirement.

Figure 7:
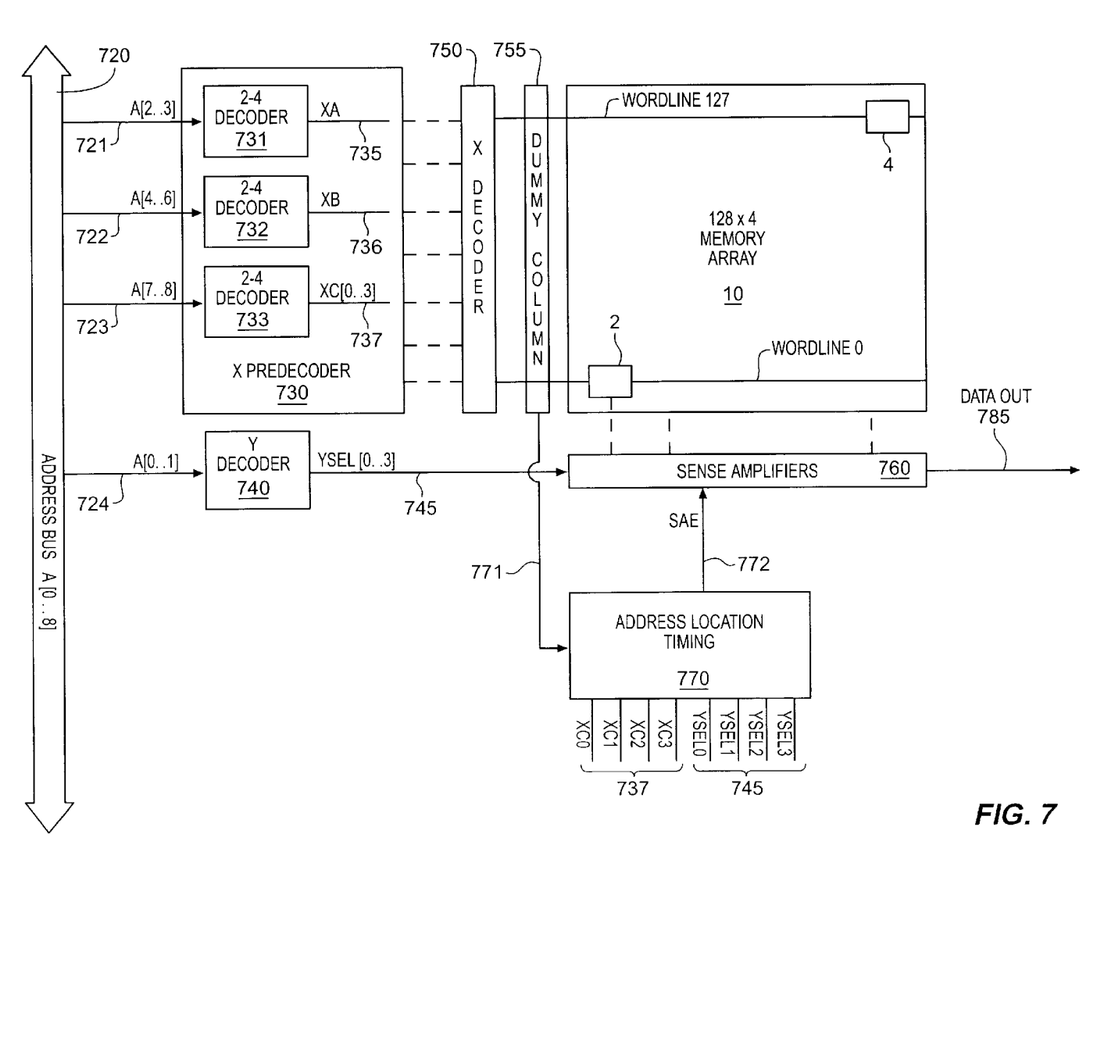
FIG. 7 illustrates a memory design including the address location timing scheme of the present invention.

FIG. 7 illustrates a memory design which includes the location based timing scheme according to one embodiment of the present invention. It should be noted that the location based timing scheme about to be described may be utilized with both synchronous or asynchronous memory designs. For example purposes, the memory array 10 discussed herein is organized in 128 wordlines and 4 bitlines, and there are 9 address bits used in the predecode and decode stages of the read operation. It would be obvious, however, to anyone skilled in the art, that any size memory array and any number of address bits may be utilized in the present invention.

The address bus 720 communicates to the X Predecoder 730 and Y Decoder 740 the address bits A[0 . . . 8] of the address that points to the location of the memory cell to be read.

The lower bits A[0 . . . 1] of the address are decoded by the Y Decoder 740 to select the four bitlines of the memory array 10. The bitlines selectors are Ysel[0 . . . 3] and they are input to the sense amplifiers 760 through the bus 745. The rest of the address bits, A[2 . . . 8], are sent to the X predecoder stage 730 of the memory design in order to predecode the 128 wordlines of the memory array 10. The higher order bits, A[7 . . . 8], are used to predecode one of the four regions of the memory array 10. The four regions are represented by the bus 737 and they are XC0, XC1, XC2, and XC3. The remaining address bits, A[2 . . . 6], are used to predecode one of the 32 lines of each region. The X decoder 750 is used to create the necessary wordline drivers for the memory array 10.

It should be noted that the various address bits chosen are merely illustrative and they are not restricted to the specific numbers elected in this embodiment of the present invention. Therefore, it will be appreciated that different address bits may be chosen to perform the predecoding and decoding stage or may be utilized in the location based timing scheme.

A memory read cycle directed to the memory array 10 begins with a predecoding stage in which buses XA 735, XB 736, and XC 737 are obtained. The X decoder 750 asserts one of the 128 wordlines of the cell to be read. The bitline selectors Ysel are also decoded.

The dummy column 755 represents a predetermined delay and enables the address location timing scheme. In one embodiment of the present invention, the dummy column of memory 755 is identical to an entire column of the memory array 10 and includes the circuitry, e.g. sense amplifier, necessary to initiate a memory read operation of the dummy column 755.

During a read operation, the wordline of the memory cell to be read is activated. At the same time, a read operation of the dummy column is initiated. The read cycle of the dummy column represents a predetermined timing that delays the enable signal 771 of the address location timing scheme. The enable signal 771 is delayed in order for the sense amplifier to achieve a minimum differential voltage required to exist between the bitlines before the sense amplifier is enabled to read the contents of a memory cell. In another embodiment of the present invention, instead of using a dummy column, the predetermined time delay of the address location timing enable signal 771 may be achieved using other types of circuitry such as inverters.

Figure 5:
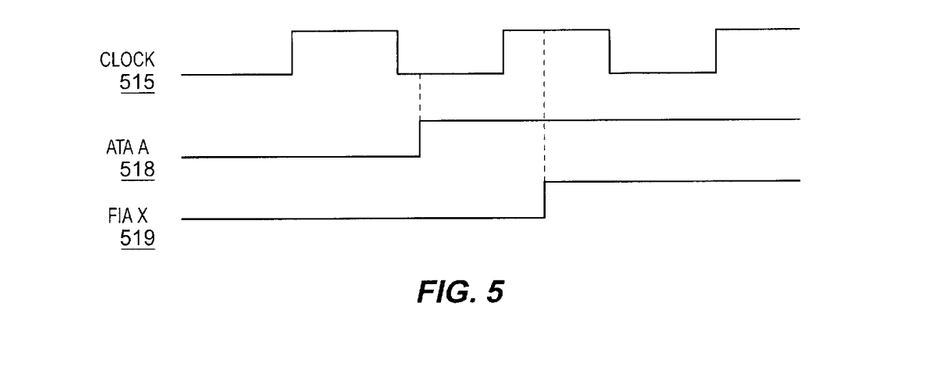
FIG. 5 is a timing diagram illustrating two data out signals.

Based on the different four wordline regions and the four bitlines, the cells in the memory array 10 have different access times. For example, cells located in the wordline region indicated by the signal XC0 can be accessed faster than cells located in the wordline region indicated by the signal XC1. Cells located in the wordline region indicated by the signal XC1 can be accessed faster than cells located in the wordline region indicated by the signal XC2, and so on. Similarly, the cells represented by the bitline Ysel 0 can be accessed faster then cells represented by the bitline Ysel1, and so on. For example, in FIG. 5, Data A is located in a memory cell that may be accessed faster than the cell represented by Data X. As such, signal 518 represented by the Data A is asserted before the signal 519 represented by Data X, hence Data A will be output faster than Data X.

In order to determine the location of the faster cells of the memory array 10, the Y decoding stage and a portion of the X predecoding stage are replicated. As such, the bus 737 representing the four signals indicating the four wordline regions: XC0, XC1, XC2, and XC3, and the Y selector signals 745: Ysel 0, Ysel 1, Ysel 2, and Ysel 3 are all replicated and they represent inputs to the address location timing 770.

The address location timing 770 includes circuitry that, based on the signals 737 and 745, adjust the timing of the sense amplifier enable SAE signal 772. As such, if a cell to be read is located in a region that is accessed faster, then the SAE signal 772 will be asserted faster. For example, if a cell to be read is located in the region determined by the signal XC0, the address location timing is able to assert the SAE signal 772 faster than it would assert it for any other cell locations. Therefore, the SAE signal 772 of the present invention is not based on a worst case read, but it is asserted as soon as data is available.

Figure 8:
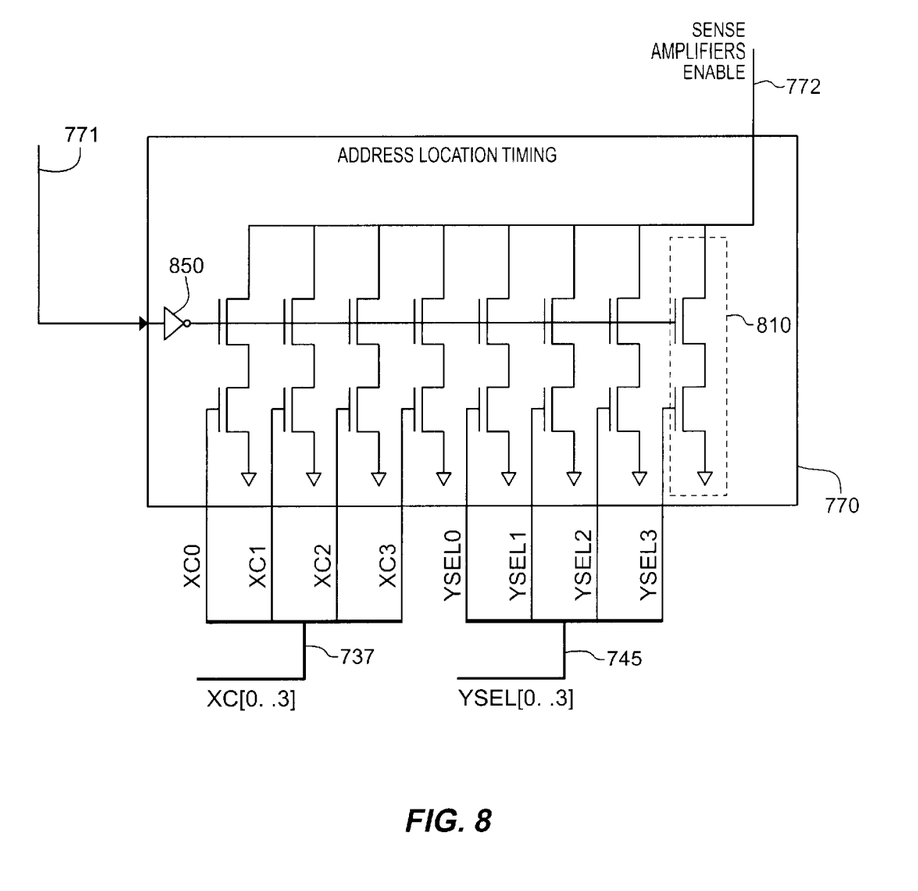
FIG. 8 illustrates the address location timing circuitry according to one embodiment of the present invention.

FIG. 8 illustrates the address location timing 770 circuitry according to one embodiment of the present invention. The signal 771 represents the enable signal of the address location timing 770. The bus 737 communicates the signals XC0, XC1, XC2, and XC3 to the address location timing 770, while the bus 745 communicates the signals Ysel 0, Ysel 1, Ysel 2, and Ysel 3 to the address location timing 770. Each of these input signals are connected to a transistor structure 810 which asserts the sense amplifier enable signal 772. For example, when signal 771 outputs a logic "0", the address location timing 770 is enabled. The inverter 850 will output a logic "1" to one of the transistors of the transistor structure 810. If a cell to be read is determined by the signals XC0 and Ysel 0, then the rows of transistors 810 corresponding to the signals XC0 and Ysel 0 will be turned "on" and the sense amplifier enable signal 772 is asserted. In one embodiment of the present invention, each row of transistors 810 have a different strength based on how fast the signal 772 needs to be asserted. For example, since the cells represented by the signal XC0 can be accessed faster than any other cells, the transistors activated by the XC0 signal have more strength than the transistors activated by the signals XC1, XC2, and XC3. Hence, the transistors activated by the XC0 signal are able to fire the signal 772 faster. Similarly, the transistors activated by the signal Ysel 0 are able to fire the signal 772 faster than the transistors activated by the signals Ysel 1, Ysel 2, and Ysel 3.

In another embodiment of the present invention, in order to adjust the timing of the signal 772 assertion, the faster the requested cell access, the more bits are used to assert the enable signal 772. For example, if a read is requested from the fastest cell in the array, all the signals 737 and 745 may be used to pull down and fire the enable signal 772. For a slower access, a reduced number of selected bits or transistors may be used.

Also, in alternate embodiments of the location based timing scheme, the firing of the signal 772 may be controlled by a set of inverters connected to each of the signals 772 and 745. The bigger the time delay needed, i.e. the slower the access, the more inverters are connected to the signals 737 or 745. The paths of the signals firing the enable 772 may be adjusted by using a various number of inverters.

Although the location based timing of present invention is described with reference to transistor structures or inverter structures, it will be appreciated that other types of devices may be used in order to adjust the timing of the sense amplifier enable signal 772.

If multiple read operations from the memory array 10 are requested, a cumulative time saving effect is realized and a considerable amount of read access time may be saved. For example, in a cache memory in which the read cycle is based on the worst case read and the data is output in two clock cycles, the location based timing scheme is able to output the data in less than two clock cycles, which improves the overall performance of the cache memory.

Since the read access time improvement depends on the region of the memory array the data is accessed from, it would be desirable to store the frequently or the recently used information in the lower region of the memory array in order to maximize the time saving benefits of the location based timing scheme.

Another advantage of the location based timing scheme is the ability to increase the frequency of the memory device. For example, if the size of the memory is lowered by storing the information in the faster, lower portion of the memory array, the frequency of the memory device is increased. This feature may be beneficial to sort products based on memory access timing. In the case that a specific memory device does not meet the designed frequency target, the device is typically downgraded to a lower frequency specification. Using the location based timing scheme of the present invention, the device may still maintain the frequency specification, but the memory specification may be lowered to meet the frequency target. As such, only the higher location of the memory device may be downgraded to a lower frequency.

It will be appreciated by anyone skilled in the art that the memory array described above may be implemented using any type of RAM devices such as: dynamic RAM (DRAM), static RAM (SRAM), EPROM, or any other memory devices.

Thus, a method and apparatus for improving the access time of a memory device is described. The location based timing scheme utilizes a subset of the address bits to adjust the timing of the sense amplifier enable in order to achieve a faster read of the information stored in the memory cell. Although certain specific embodiments have been described, various modifications and changes to the disclosed embodiments will be apparent to one of ordinary skill in the art upon reading this disclosure. Therefore, it is to be understood that the specifications and drawings are merely illustrative of and not restrictive on the broad invention, and that this invention is not limited to the specific embodiments shown and described.

What is claimed is:

1. A method for controlling a sense amplifier enable signal during a read operation in a memory array, the method comprising:

selecting a subset of address bits from an address of a memory cell to be read, wherein the subset of address bits represents one of a plurality of regions in the memory array, and wherein each region of said plurality of regions comprises a plurality of memory cells, and is associated with a distinct region access time requirement;

determining the one of said plurality of regions based on said subset of address bits;

selecting the memory cell to be read from the plurality of memory cells; and timing the sense amplifier enable signal for the memory cell to be read by:

creating a distinct time delay for each region based on each region access time requirement; and asserting the sense amplifier enable signal for the memory cell to be read after the corresponding time delay is satisfied.

2. The method as described in claim 1, wherein determining the one of said plurality of regions based on said subset of address bits comprises decoding said subset of address bits.

3. The method as described in claim 1, wherein said creating the distinct time delay for each region comprises using a transistor structure for each region.

4. The method as described in claim 3, wherein said transistor structures have various distinct specifications and each distinct time delay is determined by the specification of each transistor structure.

5. The method as described in claim 1, wherein said creating the distinct time delay for each region comprises using an inverter structure for each region.

6. A memory for use in a computer system, the memory comprising:

a memory array divided in a plurality of regions, wherein each region of the plurality of regions comprises a plurality of memory cells, and is associated with a distinct region access time requirement; and an address location timing circuit to generate a sense amplifier enable signal by:

creating a distinct time delay for each region based on each region access time requirement; and asserting the sense amplifier enable signal for a memory cell to be read after the time delay for the region containing the memory cell to be read has been satisfied.

7. The memory as described in claim 6 further comprising:

logic to generate wordline and bitline signals;

a plurality of sense amplifiers; and logic to generate input signals to the address location timing circuits, s wherein said input signals are indicative of each memory region of the plurality of regions.

8. The memory as described in claim 7, wherein said logic to generate input signals to the address location timing circuits comprises decoder circuits.

9. The memory as described in claim 6, wherein said memory array comprises a Static RAM (SRAM).

10. The memory as described in claim 6, wherein said memory array comprises a Dynamic RAM (DRAM).

11. The memory as described in claim 6, wherein said address location timing circuit comprises a plurality of transistor structures to create the distinct time delay of the sense amplifier enable signal for each region of the memory array.

12. The memory as described in claim 11, wherein said plurality of transistor structures have various distinct specifications.

13. A computer system comprising:
  a main memory; and
  a processor coupled to the main memory, wherein said processor includes an on-chip cache memory comprising:
    a memory array divided in a plurality of regions, wherein each region of the plurality of regions comprises a plurality of memory cells, and is associated with a distinct region access time requirement; and
    an address location timing circuit for controlling a sense amplifier enable signal during a memory read operation, wherein said address location timing circuit generates a sense amplifier enable signal by:
      creating a distinct time delay for each region based on each region access time requirement; and
      asserting the sense amplifier enable signal for a memory cell to be read after the time delay for the region containing the memory cell to be read has been satisfied.

14. The computer system as described in claim 13, wherein the computer system further comprises:
  an external cache memory coupled to the processor and the main memory.

15. The computer system as described in claim 13, wherein the on-chip cache memory further comprises:
  logic to generate wordline and bitline signals;
  a plurality of sense amplifiers; and
  logic to generate input signals to the address location timing circuits, wherein said input signals are indicative of each memory region of the plurality of regions.

16. The computer system as described in claim 15, wherein said logic to generate input signals to the address location timing circuits comprises decoder circuits.

17. The computer system as described in claim 13, wherein said address location timing circuit comprises a plurality of transistor structures to create the distinct time delay of the sense amplifier enable signal for each region of the memory array.

18. The computer system as described in claim 17, wherein said plurality of transistor structures have various distinct specifications.

19. A computer system comprising:
  a processor;
  a main memory coupled to the processor; and
  a cache memory coupled to the processor and the main memory, wherein said cache memory comprises:
    a memory array divided in a plurality of regions, wherein each region of the plurality of regions comprises a plurality of memory cells, and is associated with a distinct region access time requirement; and
    an address location timing circuit for controlling a sense amplifier enable signal during a memory read operation, wherein said address location timing circuit generates a sense amplifier enable signal by:
      creating a distinct time delay for each region based on each region access time requirement; and
      asserting the sense amplifier enable signal for a memory cell to be read after the time delay for the region containing the memory cell to be read has been satisfied.

20. The computer system as described in claim 19, wherein the cache memory further comprises:
  logic to generate wordline and bitline signals;
  a plurality of sense amplifiers; and
  logic to generate input signals to the address location timing circuits, wherein said input signals are indicative of each memory region of the plurality of regions.

21. The computer system as described in claim 20, wherein said logic to generate input signals to the address location timing circuits comprises decoder circuits.

22. The computer system as described in claim 19, wherein said address location timing circuit comprises a plurality of transistor structures to create a distinct time delay of the sense amplifier enable signal for each region of the memory array.

23. The computer system as described in claim 22, wherein said plurality of transistor structures have various distinct specifications.

24. A method comprising:
  receiving an address of a memory cell to be read from a memory array, the memory array having a plurality of regions each associated with a distinct access time requirement;
  identifying a region of the plurality of regions in which the memory cell resides based upon a portion of the address; and
  creating a distinct time delay for each region based on each region access time requirement; and
  reading the memory cell by enabling sense amplifiers coupled to the memory array by asserting the sense amplifier enable signal for the memory cell to be read after the corresponding time delay is satisfied.

25. The method of claim 24, wherein said creating the distinct time delay for each region comprises using different transistor structures for each region.

26. A method comprising:
  receiving a physical address of a memory cell to be read from a memory array; and
  adjusting the sensing of the memory cell by:
    creating a distinct time delay for each of a plurality of regions of the memory array based on distinct access time requirements associated with the plurality of regions; and enabling sense amplifiers coupled to the memory array after the time delay for the region containing the memory cell has been satisfied.

27. The method of claim 26, wherein said creating the distinct time delay for each region comprises using different transistor structures for each region.

28. A memory comprising:

a memory array having a plurality of regions each comprising a plurality of memory cells, and each being associated with a distinct access time requirement;

an address location timing circuit capable of generating a sense amplifier enable signal by:

creating a distinct time delay for each of a plurality of regions of the memory array based on distinct access time requirements associated with the plurality of regions; and enabling sense amplifiers coupled to the memory array for a memory cell to be read after the time delay for the region containing the memory cell has been satisfied;

decoding circuitry coupled to the memory array to generate wordline and bitline signals; and a plurality of sense amplifiers coupled to the memory array and responsive to the sense amplifier enable signal.

29. The memory of claim 28, wherein said memory array comprises one or more Static Random Access Memories.

30. The memory of claim 28, wherein said memory array comprises one or more Dynamic Random Access Memories.

* * * * *